United States Patent [19]
Pommerenke et al.

[11] Patent Number: 6,037,782
[45] Date of Patent: Mar. 14, 2000

[54] AUTOMATIC ADJUSTMENT OF CABLES WHICH AIDS IN SET-UP OF EQUIPMENT UNDER TEST FOR ELECTROMAGNETIC COMPATIBILITY MEASUREMENTS

[75] Inventors: David Pommerenke, Rocklin; Kenneth E. Hall, Weimar; Debra L. Ledsinger, Roseville, all of Calif.

[73] Assignee: Hewlett-Packard Company, Palo Alto, Calif.

[21] Appl. No.: 09/027,176

[22] Filed: Feb. 20, 1998

[51] Int. Cl.[7] .................................................. G01R 29/08
[52] U.S. Cl. .......................... 324/628; 324/501; 324/627; 343/702; 343/703
[58] Field of Search ................... 343/703, 702; 324/628, 627, 501

[56] References Cited

FOREIGN PATENT DOCUMENTS

| 0103980 | 5/1988 | Japan | 343/703 |
| 4-116471 | 4/1992 | Japan | 343/703 |
| 4-337474 | 11/1992 | Japan | 343/703 |

*Primary Examiner*—Ernest F. Karlsen
*Assistant Examiner*—Jose M. Solis

[57] ABSTRACT

Equipment under test is adjusted during set-up for electromagnetic compatibility testing. The equipment under test is placed on a base, such as a table, other structure or the ground. Positioners are connected to cables and/or subparts of the equipment under test. For example, the positioners are non-metallic pneumatic cylinders. The positioners are anchored to the base, to the device under test, or to some other structure. For various positions of an antenna relative to the equipment under test, positions of the positioners are found for which there is a maximum signal response. This is done by measuring signal response for current positions of the positioners. The current positions of the positioners are then varied using a remote control unit which controls positions of the positioners. This is repeated for as many different positions as desired. The positions which resulted in the maximum signal response is utilized for the electromagnetic compatibility testing.

20 Claims, 5 Drawing Sheets

AUTOMATIC ADJUSTMENT OF CABLES WHICH AIDS IN SET-UP OF EQUIPMENT UNDER TEST FOR ELECTROMAGNETIC COMPATIBILITY MEASUREMENTS

BACKGROUND

The present invention concerns electromagnetic compatibility measurements and pertains particularly to automatic adjustment of cables which aids in set-up of equipment under test for electromagnetic compatibility measurements.

In order to comply with various regulations and to satisfy performance requirements of consumer, electronic equipment are required to conduct and radiate less than a maximum limit of unwanted electromagnetic energy and are required to have a certain level of immunity against other electromagnetic sources. Measurement methods are supplied in standards such as IEC 1000-4-3, IEC 1000-4-6, ANSI C63.4, CISPR 22.

The coupling of energy to and from a system is not only influenced by the design of the system but also by the set-up of the system, as particularly as pertains to distances between a ground plane and various subparts of the system. The routing of cables also can have a significant impact on the coupling of energy.

For example, ANSI C63.4 in 6.2.1.3 and CISPR 22 in 9.1, and the relating regulation of the European Community require cable maximization in emissions measurement. For example CISPR requires that "An attempt shall be made to maximize the disturbance consistent with the typical applications by varying the configuration of the test sample . . . The effects of varying the position of the cables shall be investigated to find the configuration that produces maximum disturbances."

Not only emissions measurement results, but also immunity measurement results strongly depend upon cable routing and equipment under test (EUT) setup.

In the past, the cable and set up influence has often been completely ignored. However, now if the cable and set up influence are ignored the result may be that requirements required by law may not be fulfilled resulting in a risk of high fines, shipment halts, expensive retesting, expensive changes to products and market release, and/or loss of reputation.

In some cases the cable and setup influence is not investigated on each test but the possible influence of the cable and setup are taken into account by reducing the acceptable limits in emission testing and by increasing the test level during immunity testing. However, the influence of cable routing and test setup may vary by a large amount even in response to subtle changes in position. To avoid shipping electronic systems which do not fulfill the legal or customer requirements, a significant reduction in the emission level and a significant increase in the immunity level may required when the possible influence of the cable and setup are taken into account in this way.

Further, when cable and setup influence is not investigated on each test but the possible influence of the cable and setup are taken into account by reducing the acceptable limits in emission testing and by increasing the test level during immunity testing, this can result in the necessity of investment of additional material and design effort to comply with the reduced limit in emission testing and to deal with the increased test level in immunity testing. This additional material and design effort is unnecessary when exact knowledge on cable and setup influence is obtained.

Also, to attempt to obtain exact knowledge on cable and setup influence, the influence of cable routing and setup can be investigated by hand with test interruption. To do this, the test area is entered and the cable routing and/or the setup is changed. However, to avoid potentially hazardous fields, during immunity testing, the generation of testing signals needs to be halted when performing immunity testing. While testing for emission levels of equipment under test, it is generally not necessary for an operator to turn off the test equipment before entering the testing area. Additionally, because of potential influence on testing levels for both immunity testing and emissions testing, it is generally advisable that an operator leave the test area while testing is actually being performed. Such a testing process can be very time consuming when a number of different cable and setup positions are tested.

To reduce the time of testing, during emissions testing, the operator can remain within the testing area to allow for quicker adjustment of the setup and cables. Because of the potentially hazardous fields, however, it is generally not advisable for an operator to be present during immunity testing. Additionally, the presence of personal within the testing area can have a detrimental impact on testing. It may then be necessary to take this into account by reducing the acceptable limits in emission testing. In any event the manipulations required even when the operator are present are still very time consuming.

SUMMARY OF THE INVENTION

In accordance with the preferred embodiment of the present invention, equipment under test is adjusted during set-up for electromagnetic compatibility testing. For example, equipment under test is placed on a base, such as table, some other supporting structure or the ground. Positioners are connected to cables of the equipment under test. Additionally, positioners may be connected to subparts of the equipment under test. For example, the positioners are non-metallic pneumatic cylinders. The positioners are anchored to the base, to the equipment under test, or to some other structure. For various positions of an antenna relative to the equipment under test, positions of the positioners are found for which there is a maximum signal response. This is done by measuring signal response for current positions of the positioners. The current positions of the positioners are then varied using a remote control unit which controls positions of the positioners. This is repeated for as many different positions as desired. The positions which resulted in the maximum signal response is utilized for the electromagnetic compatibility testing.

In the preferred embodiment, the base, or the equipment under test directly, is placed on a rotatable platform and additional positioners are anchored on the rotatable platform. The position of the antenna relative to the equipment under test is varied by rotating the rotatable platform and moving the antenna.

For example, the electromagnetic compatibility testing is immunity testing and positions of the positioners are found for which the equipment under test has a maximum signal response to testing signals. Alternatively, the electromagnetic compatibility testing is emissions testing and positions of the positioners are found for which the signals have a maximum effect on the equipment under test.

In one embodiment of the present invention, positions of the positioners are found for which there is a maximum signal response, by measuring signal response for current positions of the positioners. Then the current position of one of the positioners is optimized. This is repeated for each positioner for which position of the positioner affects signal response.

The present invention provides for efficient and thorough adjustment of equipment under test for electromagnetic compatibility measurements without any detrimental impact on test results. The present invention also facilitates automation of set-up and increased efficiency in sensitivity analysis.

DESCRIPTION OF THE PREFERRED EMBODIMENTS

Figure 1:
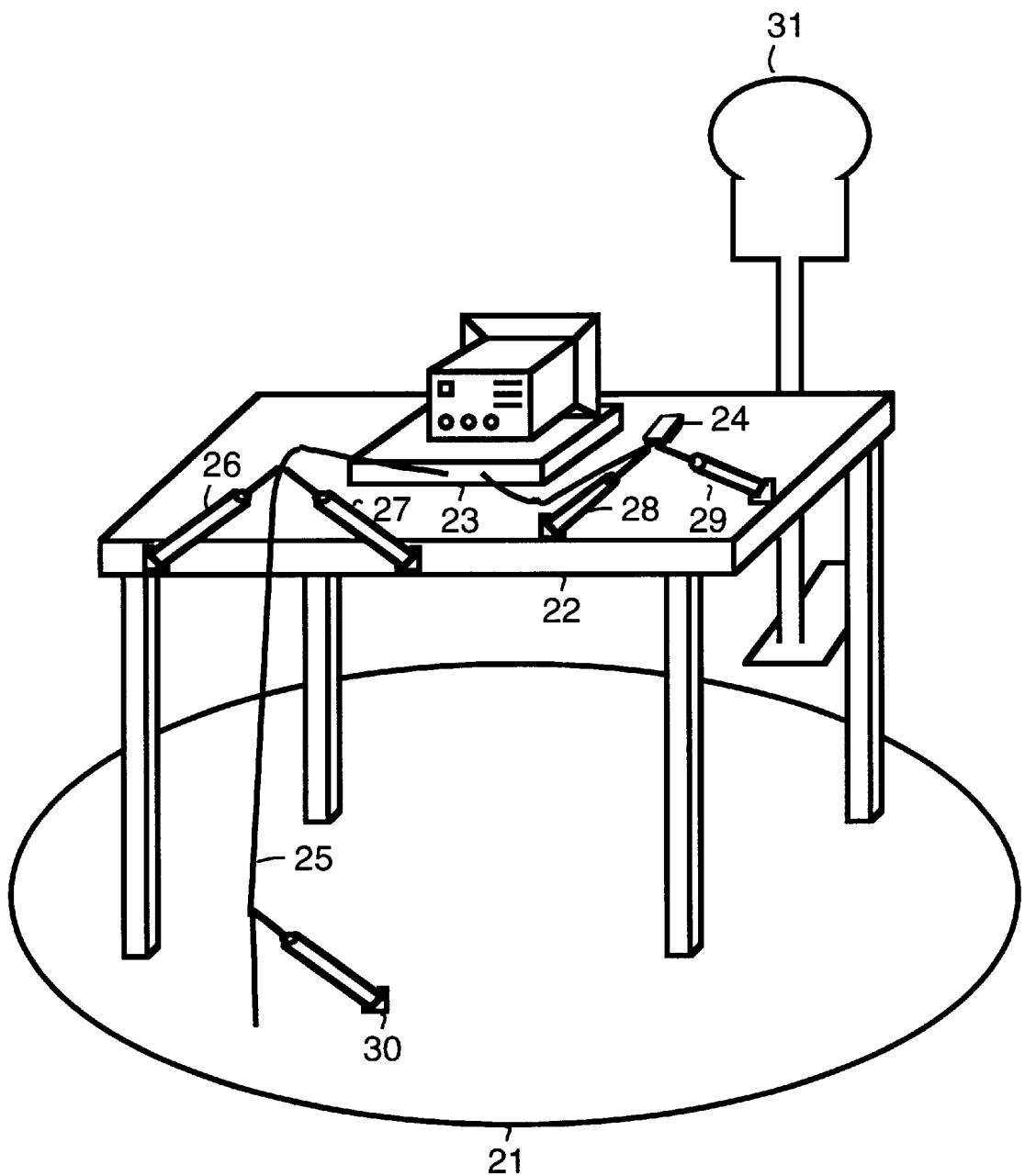
FIG. 1 is a simplified diagram which shows equipment under test placed within a testing area in accordance with a preferred embodiment of the present invention.

FIG. 1 is a simplified diagram which shows equipment under test (EUT) 23 placed upon a table 22. Alternatively, equipment under test 23 may be placed on another supporting structure, or directly on the ground. A mouse 24 and a power cable 25, while numbered separately, are also considered parts of equipment under test 23. Specifically, mouse 24 is a subpart of equipment under test 23. Power cable 25 is part of the cabling for equipment under test 23.

Table 22 is placed upon a rotating platform 21. Alternatively, table 22 may be placed directly on the ground or on some other supporting structure.

For example, table 22 is 80 centimeters high. An antenna 31 within the testing area is used to transmit signal during immunity testing and is used to detect emissions during emissions testing. For example, for emissions testing, antenna 31 is one to four meters high and is located ten meters from table 22. For example, for immunity testing, antenna 31 is one to four meters high and is located three meters from table 22. Alternatively, antenna 31 may be other heights and placed other distances from table 22, depending upon the requirements of testing.

During immunity testing and emissions testing, non-metallic cylinders are used to adjust cabling and system subparts of equipment under test 23. The non-metallic cylinders are, for example, hydraulically controlled cylinders, pneumatically controlled cylinders, or other non-electronically controlled cylinders.

For example, in FIG. 1, a non-metallic cylinder 26, a non-metallic cylinder 27 and a non-metallic cylinder 30 are used to adjust the position of power cable 25 during testing. Likewise, a non-metallic cylinder 28 and a non-metallic cylinder 29 are used to adjust the position of mouse 24, which is a system subpart of equipment under test 23.

Additional non-metallic cylinders can be used to adjust the position of other cables and or system subparts of equipment under test 23. For example, non-metallic cylinders 26, 27, 28, 29 and 30 are pneumatically controlled because this reduces the amount of electrical current within the testing area.

Figure 2:
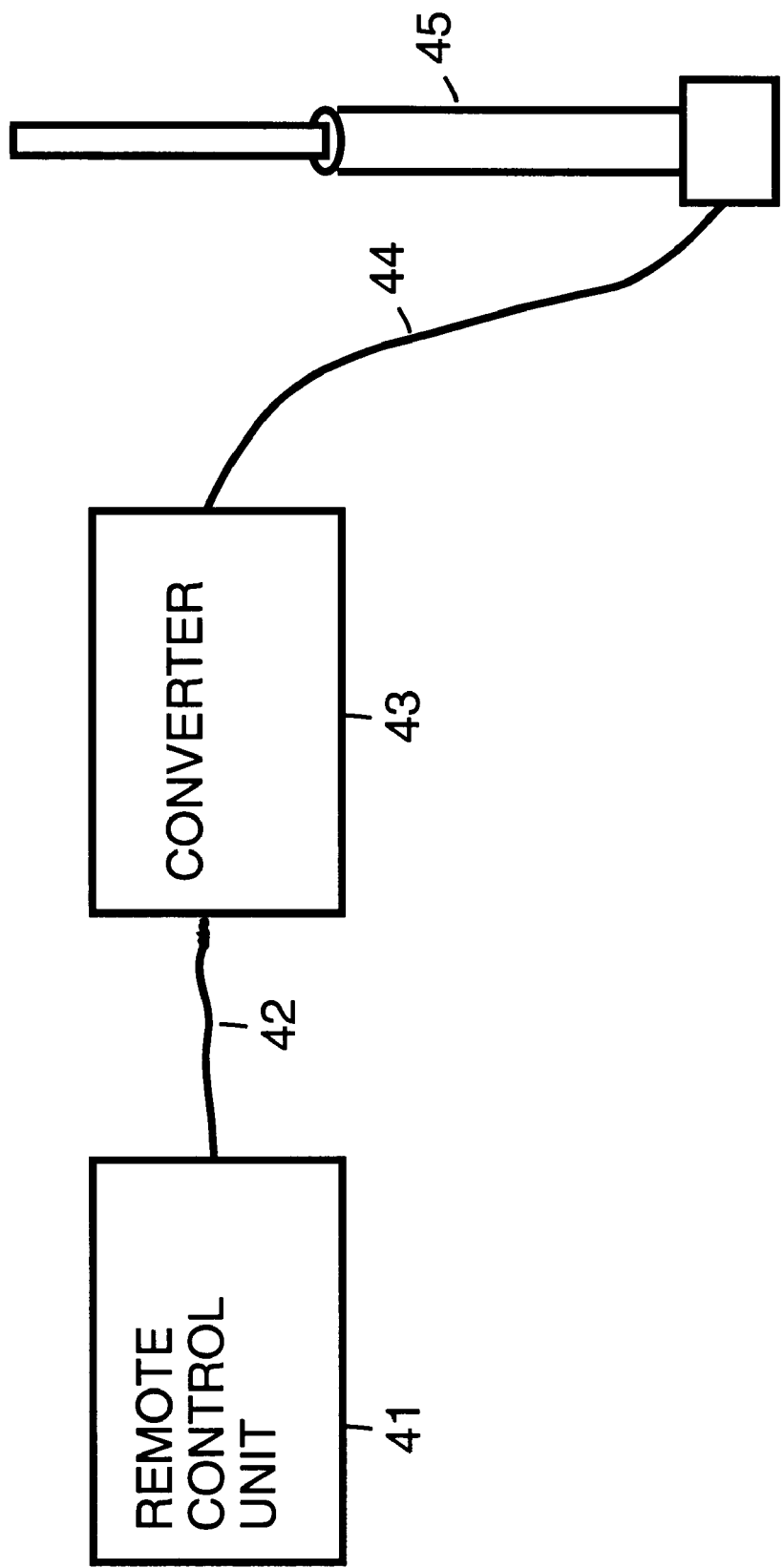
FIG. 2 is a simplified block diagram of a control system which controls non-metallic cylinders which adjust cable position and location of equipment subparts for equipment under test in accordance with a preferred embodiment of the present invention.

FIG. 2 is a simplified block diagram of a control system which controls a non-metallic cylinder 45. Non-metallic cylinder 45 is, for example, a hydraulically controlled cylinder, a pneumatically controlled cylinders, or some other type of non-electronically controlled cylinder.

A remote control unit 41 is used to control one or more non-metallic cylinders. Remote control unit 41 is connected to a converter 43 through a connector 42. For example connector 42 is electrical wiring or fiber optical wiring. Converter 43 converts control signal received over connector 42 into a media to control a non-metallic cylinder 45. Converter 43 is connected to non-metallic cylinder 45 through a connector 44. When non-metallic cylinder 45 is a pneumatic cylinder, connector 44 is an air hose. When non-metallic cylinder 45 is a hydraulically controlled cylinder, connector 44 is, for example, a water hose. FIG. 2 shows converter 43 connected only to non-metallic cylinder 45. In other embodiments of the present invention, converter 43 may be used to control other non-metallic cylinders, the actual number depending upon the specific design implementation of converter 43.

Figure 3:
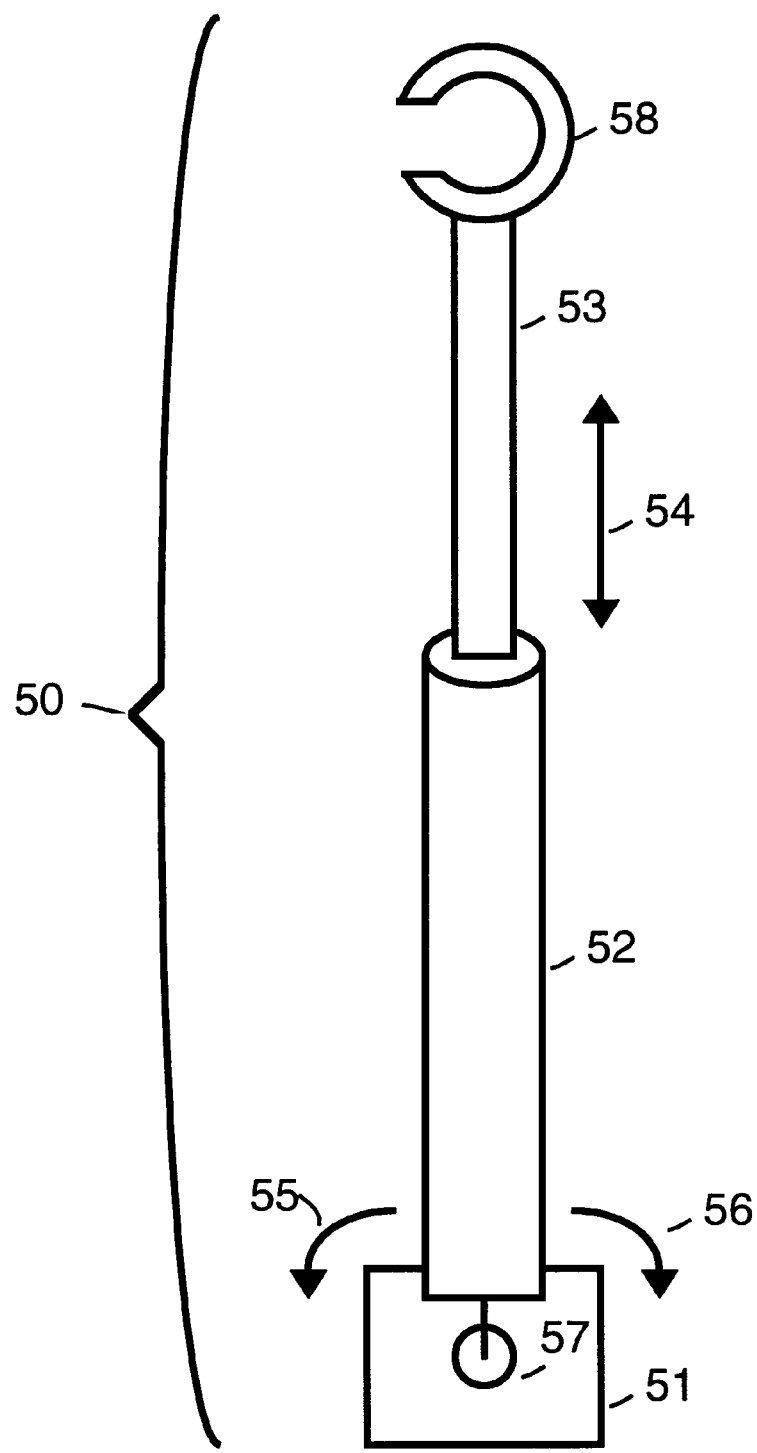
FIG. 3 is a simplified diagram of a non-metallic cylinder in accordance with a preferred embodiment of the present invention.

FIG. 3 is a simplified diagram of a non-metallic cylinder 50 in accordance with a preferred embodiment of the present invention. Non-metallic cylinder 50 is, for example, a hydraulically controlled cylinder, a pneumatically controlled cylinders, or some other type of non-electronically controlled cylinder.

A cylinder housing 52 is anchored to a table or platform via a physical connector 51. A joint 57 connecting cylinder housing 52 to physical connector 51 provides for adjustment of angular direction of non-metallic cylinder 50, as illustrated by an arrow 55 and an arrow 56. A rod 53 moves in and out of cylinder housing 52, as represented by an arrow 54. Upon the top of rod 53, a connector, as illustrated by connector 58, is used to connect non-metallic cylinder 50 to a cable and/or a sub-system part of the equipment under test.

Figure 4:
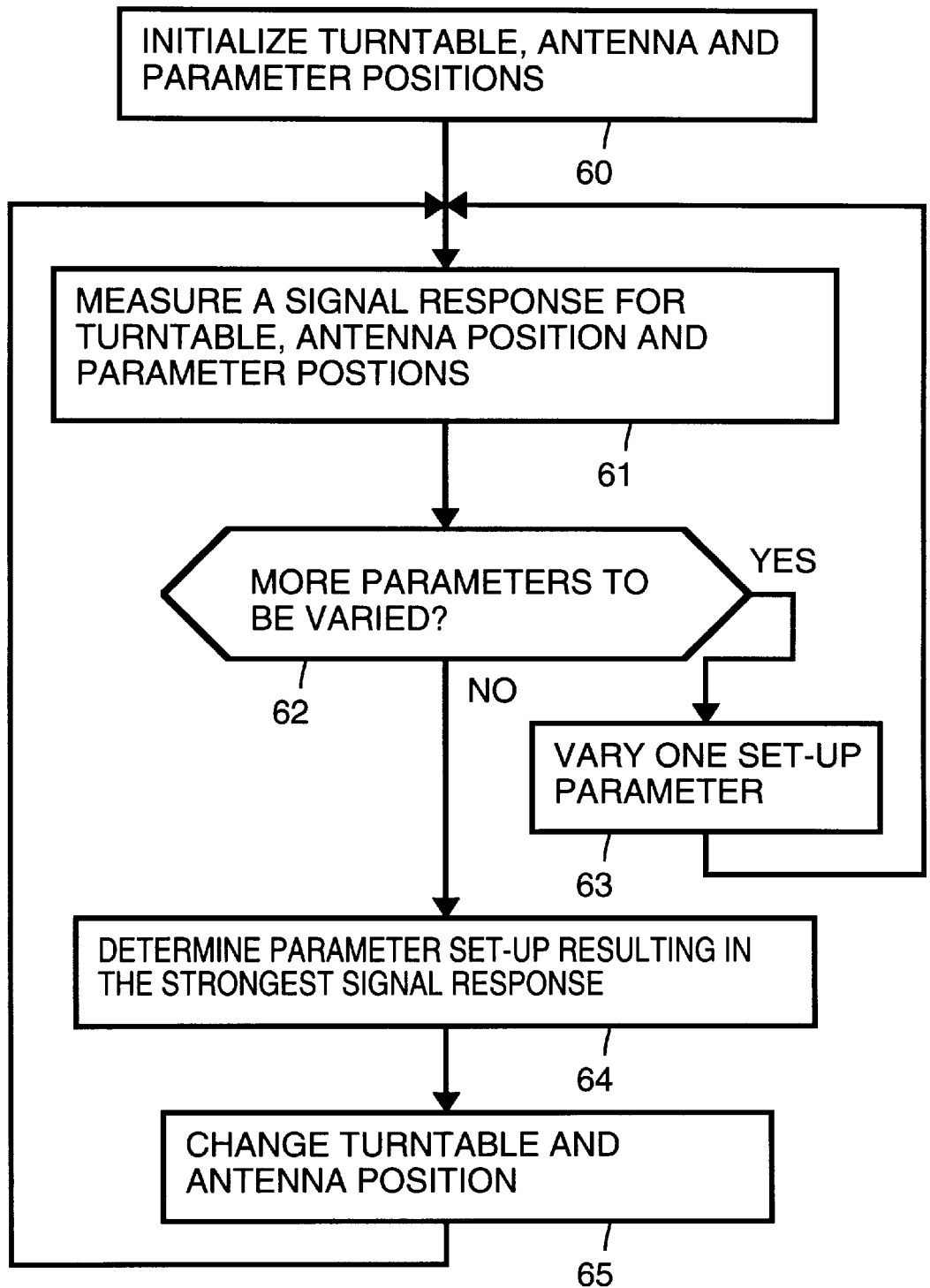
FIG. 4 is a flow chart which describes a procedure for testing in accordance with a preferred embodiment of the present invention.

FIG. 4 is a flow chart which describes a procedure for testing in accordance with a preferred embodiment of the present invention. The testing is done to find a set-up position and cable position where electromagnetic signals have a maximum effect. For emissions testing, this is the position of the equipment under test and cabling where the antenna detects the strongest electromagnetic signals. For immunity testing this is the position of the equipment under test and cabling so that signals emitted from the antenna have the greatest effect on the equipment under test.

In a step 60, the position of the rotating platform (turntable), the antenna and the extension distance of the non-metallic cylinders (parameters) are initialized.

In a step 61, a signal response is measured for the current position of the rotating platform (turntable), the antenna and the extension distance of the non-metallic cylinders (parameters). For emission testing, the signal response is the signal strength at the antenna resulting from emissions from the equipment under test. For immunity testing, the signal response is the effect on the system resulting from electromagnetic signals from the antenna.

For the test, the extension distance of each non-metallic cylinders (parameter) is adjusted. Each adjustment is, for example a set distance (e.g., a couple centimeters, or a fraction of a wavelength of the signal frequency). If an exhaustive test is desired, every parameter combination is tested for each position of the turntable and antenna. Alternatively, a subset of possible parameter combinations are tested for each position of the turntable and antenna.

In a step 62, it is determined whether for the current turntable and antenna position, there are parameter combinations which have not been tested. That is, during the course of the test, for every turntable and antenna position tested, the extension distance of each non-metallic cylinders (parameter) is adjusted. Each adjustment set distance (e.g., or example, a set distance (e.g., a couple centimeters, or a fraction of a wavelength of the signal frequency) of movement of the extension distance of a non-metallic cylinder. If an exhaustive test is desired, every parameter combination is tested for each position of the turntable and antenna. Alternatively, a subset of possible parameter combinations are tested for each position of the turntable and antenna.

If in step 62 it is determined that for the current turntable and antenna position there are parameter combinations which have not been tested, in a step 63 one set-up parameter is adjusted and step 61 is repeated.

If in step 62 it is determined that for the current turntable and antenna position there are no remaining parameter combinations to be tested, in a step 64 the parameter set-up for the current turntable and antenna position which had the largest signal response is determined. This parameter set-up and the resulting signal response is recorded for later reference.

In a step 65, the position of the turntable and the antenna are adjusted. These are adjusted for example, by moving the antenna nearer or farther from the turntable, and/or rotating the turntable a fraction of a turn. The testing then begins anew. This testing is repeated until all desired positions of the antenna and turntable have been tested. The process may be repeated for other signal frequencies.

Figure 5:
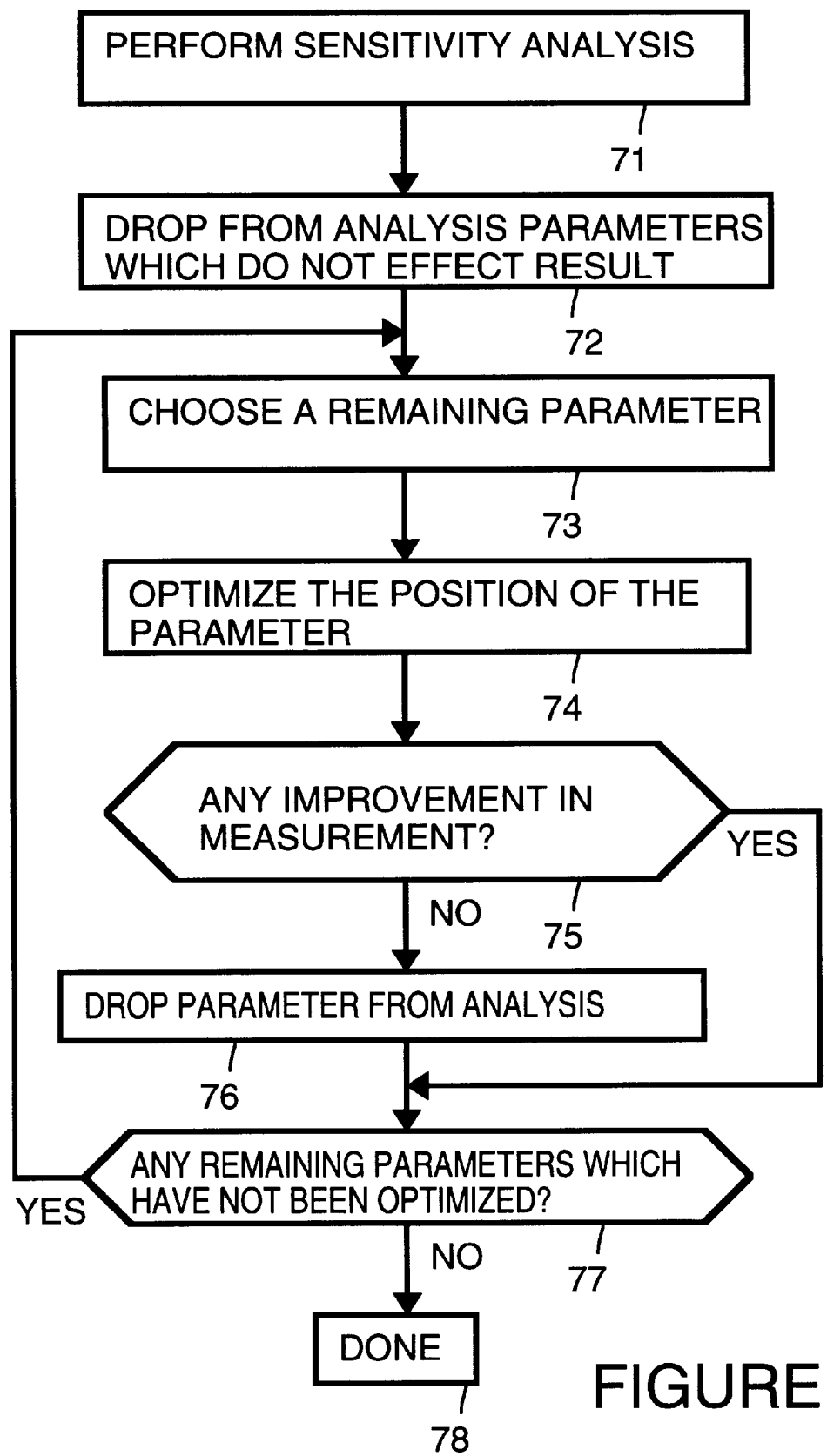
FIG. 5 is a flow chart which describes a procedure for automatically adjusting the position of cylinders into optimum positions for testing in accordance with an alternative preferred embodiment of the present invention.

In many cases exhaustive testing of signal response at all potential parameter positions is not feasible. FIG. 5 is a flow chart which describes a procedure for automatically adjusting the position of electric/pneumatic cylinders (parameters) into optimum positions for testing in accordance with an alternative preferred embodiment of the present invention.

In a step 71, a sensitivity analysis is performed. Each parameter is varied to see if there is any effect from varying the parameter. In a step 72, any parameter which does not effect results is removed from analysis.

In a step 73, one of the remaining parameters is selected. In a step 74, the position of the parameter is optimized. For emissions testing, this is the position of the parameter where the antenna detects the strongest electromagnetic signals. For immunity testing this is the position of the parameter so that signals emitted from the antenna have the greatest effect on the equipment under test.

In a step 75, it is determined whether optimizing the chosen parameter results in any improvement (i.e., for emissions testing the antenna detects a stronger electromagnetic signals and for immunity testing signals emitted from the antenna have a greater effect on the EUT). If there is no improvement, in a step 76, the parameter is dropped form the list.

In a step 77, it is determined whether there are any remaining parameters (i.e., parameters not dropped from analysis) which have not yet been optimized. If so, step 73 is repeated. If in step 77, it is determined there are no remaining parameters which have not yet been optimized, in a step 78, the adjustment of the position of electric/ pneumatic cylinders (parameters) into optimum positions for testing is completed.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for adjusting set-up of equipment under test for electromagnetic compatibility testing comprising the following steps:
    (a) connecting positioners to cables of the equipment under test, the positioners being for adjusting position of the cables; and,
    (b) finding positions of the positioners for which there is a maximum signal response, including the following substeps:
        (b.1) measuring signal response for current positions of the positioners,
        (b.2) varying current positions of the positioners, the current positions being varied using a remote control unit which controls positions of the positioners,
        (b.3) repeating substeps (b.1) and (b.2) a predetermined number of times, and
        (b.4) determining a maximum signal response for all current positions of the positioners measured in substep (b.1).

2. A method as in claim 1 wherein in step (a) the positioners are non-metallic pneumatic cylinders.

3. A method as in claim 1 wherein step (a) includes the following substeps:
    (a.1) placing the equipment under test on a table, and
    (a.2) anchoring a first plurality of the positioners on the table.

4. A method as in claim 1 wherein step (a) additionally includes the following substeps:
    (a.3) placing the table on a rotatable platform, and
    (a.4) anchoring a second plurality of the positioners on the rotatable platform.

5. A method as in claim 4 additionally comprising the following step:
    (c) repeating step (b) for different positions of the rotatable platform.

6. A method as in claim 1 additionally comprising the following step:
    (c) repeating step (b) for different distances between the equipment under test and an antenna used during the electromagnetic compatibility testing.

7. A method as in claim 1 wherein the electromagnetic compatibility testing is immunity testing and wherein in step (b) positions of the positioners are found for which the equipment under test has a maximum effect on testing signals.

8. A method as in claim 1 wherein the electromagnetic compatibility testing is emissions testing and wherein in step (b) positions of the positioners are found for which maximum signal emissions from the equipment under test are detected.

9. A method as in claim 1 wherein step (a) includes connecting positioners to subparts of the equipment under test.

10. A method for adjusting equipment under test during set-up for electromagnetic compatibility testing comprising the following steps:

(a) placing the equipment under test on a table;

(b) connecting positioners to cables of the equipment under test, including anchoring the positioners on the table, the positioners being for adjusting position of the cables; and, (c) for a plurality of positions of an antenna relative to the equipment under test, finding positions of the positioners for which there is a maximum signal response, including the following substeps:

(c.1) measuring signal response for current positions of the positioners, (c.2) varying current positions of the positioners, the current positions being varied using a remote control unit which controls positions of the positioners, (c.3) repeating substeps (c.1) and (c.2) a predetermined number of times, and (c.4) determining a maximum signal response for all current positions of the positioners measured in substep (c.1).

11. A method as in claim 10 wherein in step (b) the positioners are non-metallic pneumatic cylinders.

12. A method as in claim 10 wherein step (b) includes the following substeps:

(b.1) placing the table on a rotatable platform, and (b.2) anchoring a additional positioners on the rotatable platform.

13. A method as in claim 10 wherein step (b) includes connecting positioners to subparts of the equipment under test.

14. A method as in claim 12 wherein step (c) additionally comprises the following step:

(c) varying position of the antenna relative to the equipment under test by rotating the rotatable platform and moving the antenna.

15. A method as in claim 10 wherein the electromagnetic compatibility testing is immunity testing and wherein in step (c) positions of the positioners are found for which the equipment under test has a maximum effect on testing signals.

16. A method as in claim 10 wherein the electromagnetic compatibility testing is emissions testing and wherein in step (c) positions of the positioners are found for which maximum signal emissions from the equipment under test are detected.

17. A method for adjusting equipment under test during set-up for electromagnetic compatibility testing comprising the following steps:

(a) connecting positioners to cables of the equipment under test, the positioners being for adjusting position of the cables; and, (b) finding positions of the positioners for which there is a maximum signal response, including the following substeps:

(b.1) measuring signal response for current positions of the positioners, (b.2) optimizing current position of one of the positioners, the current position being varied using a remote control unit which controls position of the positioner, (b.3) repeating substeps (b.1) and (b.2) for each positioner for which position of the positioner affects signal response, and (b.4) determining a maximum signal response from those measured in substep (b.1).

18. A method as in claim 17 wherein in step (a) the positioners are non-metallic pneumatic cylinders.

19. A method as in claim 17 wherein the electromagnetic compatibility testing is immunity testing and wherein in step (b) positions of the positioners are found for which the equipment under test has a maximum signal response to testing signals.

20. A method as in claim 17 wherein the electromagnetic compatibility testing is emissions testing and wherein in step (b) positions of the positioners are found for which maximum signal emissions from the equipment under test are detected.

* * * * *

UNITED STATES PATENT AND TRADEMARK OFFICE
CERTIFICATE OF CORRECTION

| | |
|---|---|
| PATENT NO. | : 6,037,782 |
| APPLICATION NO. | : 09/027176 |
| DATED | : March 14, 2000 |
| INVENTOR(S) | : David Pommerenke et al. |

Page 1 of 1

It is certified that error appears in the above-identified patent and that said Letters Patent is hereby corrected as shown below:

IN THE SPECIFICATION

Column 5, (line 11) delete "set distance (e.g.," and insert therefor --of a parameter is,--

Column 5, (line 12) delete "or example" and insert therefor --for example--

Signed and Sealed this

Seventeenth Day of July, 2007

JON W. DUDAS
*Director of the United States Patent and Trademark Office*